United States Patent
DeGroot et al.

(10) Patent No.: US 9,059,349 B2
(45) Date of Patent: Jun. 16, 2015

(54) MOISTURE RESISTANT PHOTOVOLTAIC DEVICES WITH IMPROVED ADHESION OF BARRIER FILM

(75) Inventors: Marty W. DeGroot, Midland, MI (US); Paul R. Elowe, Midland, MI (US)

(73) Assignee: DOW GLOBAL TECHNOLOGIES LLC, Midland, MI (US)

( * ) Notice: Subject to any disclaimer, the term of this patent is extended or adjusted under 35 U.S.C. 154(b) by 445 days.

(21) Appl. No.: 13/005,420

(22) Filed: Jan. 12, 2011

(65) Prior Publication Data

US 2011/0192453 A1     Aug. 11, 2011

Related U.S. Application Data

(60) Provisional application No. 61/302,687, filed on Feb. 9, 2010.

(51) Int. Cl.
| | |
|---|---|
| *H01L 31/00* | (2006.01) |
| *H01L 31/048* | (2014.01) |
| *H01L 31/0216* | (2014.01) |
| *H01L 31/0224* | (2006.01) |
| *H01L 31/0392* | (2006.01) |

(52) U.S. Cl.
CPC ........ *H01L 31/048* (2013.01); *H01L 31/02161* (2013.01); *H01L 31/022408* (2013.01); *H01L 31/022466* (2013.01); *H01L 31/03923* (2013.01); *Y02E 10/541* (2013.01)

(58) Field of Classification Search
USPC ........................................................ 136/256
See application file for complete search history.

(56) References Cited

U.S. PATENT DOCUMENTS

| | | | |
|---|---|---|---|
| 3,988,167 A | 10/1976 | Kressel et al. | |
| 4,401,839 A * | 8/1983 | Pyle .............................. | 136/251 |

(Continued)

FOREIGN PATENT DOCUMENTS

| | | |
|---|---|---|
| DE | 44 42 824 | 1/1996 |
| DE | 196 11 410 | 8/1997 |

(Continued)

OTHER PUBLICATIONS

Thin Solid Films, Tucci et al., "Innovative design of amorphous/crystalline silicon heterojunction solar cell", vol. 516, p. 6771-6774, (2008).

(Continued)

*Primary Examiner* — Eli Mekhlin
(74) *Attorney, Agent, or Firm* — Kagan Binder, PLLC

(57) ABSTRACT

The present invention provides strategies for improving the adhesion between a barrier region, a transparent conductive region, and/or an electrically conductive grid through the use of an adhesion promoting region. The adhesion promoting region is optically transmissive and comprises a metal layer, a metal nitride layer, a metal carbide layer, or a combination thereof and preferably comprises at least one of Cr, Ti, Ta, and Zr or a combination thereof. These strategies are particularly useful in the fabrication of heterojunction photovoltaic devices such as chalcogenide-based solar cells. Adhesion is improved to such a degree that grid materials and dielectric barrier materials can cooperate to provide a hermetic seal over devices to protect against damage induced by environmental conditions, including damage due to water intrusion. The adhesion promoting region also serves as a barrier to the migration of Na, Li, and the lanthanoid series of elements.

12 Claims, 9 Drawing Sheets

(56) References Cited

U.S. PATENT DOCUMENTS

| | | | |
|---|---|---|---|
| 4,646,424 | A | 3/1987 | Parks et al. |
| 4,726,850 | A | 2/1988 | Wenham et al. |
| 4,748,130 | A | 5/1988 | Wenham et al. |
| 4,754,544 | A * | 7/1988 | Hanak .............. 438/66 |
| 4,952,904 | A | 8/1990 | Johnson et al. |
| 5,181,968 | A | 1/1993 | Nath et al. |
| 5,626,688 | A | 5/1997 | Probst et al. |
| 5,870,129 | A * | 2/1999 | Ikegawa et al. .............. 347/155 |
| 5,942,446 | A | 8/1999 | Chen et al. |
| 5,948,176 | A * | 9/1999 | Ramanathan et al. ........ 136/264 |
| 6,020,556 | A * | 2/2000 | Inaba et al. ................... 136/256 |
| 6,091,019 | A | 7/2000 | Sakata et al. |
| 6,091,021 | A | 7/2000 | Ruby et al. |
| 6,259,016 | B1 * | 7/2001 | Negami et al. ................ 136/265 |
| 6,383,576 | B1 * | 5/2002 | Matsuyama .................. 427/585 |
| 7,033,930 | B2 | 4/2006 | Kozhukh et al. |
| 7,253,521 | B2 * | 8/2007 | Ahn et al. ...................... 257/751 |
| 7,271,333 | B2 * | 9/2007 | Fabick et al. ................. 136/256 |
| 7,425,506 | B1 | 9/2008 | Kailasam |
| 2002/0153039 | A1 | 10/2002 | Moon et al. |
| 2004/0161872 | A1 | 8/2004 | Gonsiorawski et al. |
| 2007/0175508 | A1 | 8/2007 | Park |
| 2008/0053519 | A1 | 3/2008 | Pearce et al. |
| 2008/0105302 | A1 | 5/2008 | Lu et al. |
| 2008/0178932 | A1 | 7/2008 | Den Boer et al. |
| 2008/0223436 | A1 * | 9/2008 | den Boer et al. ............. 136/256 |
| 2008/0245765 | A1 | 10/2008 | Khaselev et al. |
| 2008/0251117 | A1 | 10/2008 | Schubert et al. |
| 2009/0126791 | A1 * | 5/2009 | Lu et al. ........................ 136/258 |
| 2009/0320916 | A1 | 12/2009 | Yuan et al. |
| 2010/0012185 | A1 | 1/2010 | Schmid et al. |
| 2010/0032701 | A1 | 2/2010 | Fudeta |
| 2010/0144079 | A1 | 6/2010 | Mayer et al. |
| 2010/0243046 | A1 | 9/2010 | Degroot et al. |
| 2011/0168243 | A1 | 7/2011 | Elowe et al. |

FOREIGN PATENT DOCUMENTS

| | | |
|---|---|---|
| DE | 197 07 280 | 8/1998 |
| EP | 1 365 458 | 11/2003 |
| JP | 2000-058885 | 2/2000 |
| JP | 2001513264 W * | 8/2001 |
| JP | 2001513264 A * | 12/2001 |
| KR | 100850641 | 8/2008 |
| WO | WO 02/15282 | 2/2002 |
| WO | WO 2006/005116 | 1/2006 |
| WO | WO 2008/107194 | 9/2008 |
| WO | WO 2009/012346 | 1/2009 |
| WO | WO 2009/078936 | 6/2009 |
| WO | WO 2009/140117 | 11/2009 |

OTHER PUBLICATIONS

Prog. Photovolt. Res. Appl., Engelhart et al., "Laser Ablation of $SiO^2$ for Locally Contacted Si Solar Cells With Ultra-short Pulses", vol. 15, p. 521-527, (2007).

Plasma Process. Polym., Wolf et al., "Moisture Barrier Films Deposited on PET by ICPECVD of $SiN_x$," vol. 4, p. S185-S189, (2007).

Wasa et al., "Handbook of Sputter Deposition Technology Principles, Technology and Applications," 1992; p. 230-231; Noyes Publications, Park Ridge, New Jersey, USA.

Barber, G.D., et al. "New Barrier Coating Materials for PV Module Backsheets: Preprint", 29th IEEE PVSC-Conference Paper, NREL/CP-520-31473, (May 2002), p. 1-5.

Glick, S.H., et al. "Silicon Oxynitride Thin Film Barriers for PV Packaging", 2005 DOE Solar Energy Technologies Program Review Meeting-Conference Paper. NREL/CP-520-38959, (Nov. 2005), p. 1-2.

* cited by examiner

MOISTURE RESISTANT PHOTOVOLTAIC DEVICES WITH IMPROVED ADHESION OF BARRIER FILM

PRIORITY

The present nonprovisional patent Application claims priority under 35 U.S.C. §119(e) from U.S. Provisional patent application having Ser. No. 61/302,687 filed on Feb. 9, 2010, by DeGroot et al. and titled MOISTURE RESISTANT PHOTOVOLTAIC DEVICES WITH IMPROVED ADHESION OF BARRIER FILM, wherein the entirety of said provisional patent application is incorporated herein by reference.

FIELD OF THE INVENTION

The present invention relates to photovoltaic devices of the type incorporating a conductive collection grid that facilitates ease of making external electrical connections, and more particularly to chalcogenide-containing photovoltaic devices with improved adhesion between a barrier layer and an adjacent layer in such devices, wherein the improved adhesion helps provide the devices with enhanced moisture resistance.

BACKGROUND OF THE INVENTION

Both n-type chalcogenide compositions and/or p-type chalcogenide compositions have been incorporated into components of heterojunction photovoltaic devices. The p-type chalcogenide compositions have been used as the photovoltaic absorber region in these devices. Illustrative p-type, photovoltaically active chalcogenide compositions often include sulfides and/or selenides of at least one or more of aluminum (Al), copper (Cu), indium (In), and/or gallium (Ga). More typically at least two or even all three of Cu, In, and Ga are present. Such materials are referred to as CIS, CIAS, CISS, CIGS, and/or CIGSS compositions, or the like (collectively CIGS compositions hereinafter).

Absorbers based upon CIGS compositions offer several advantages. As one, these compositions have a very high cross-section for absorbing incident light. This means that CIGS-based absorber layers that are very thin can capture a very high percentage of incident light. For example, in many devices, CIGS-based absorber layers have a thickness in the range of from about 2 µm to about 3 µm. These thin layers allow devices incorporating these layers to be flexible. This is in contrast to silicon-based absorbers. Silicon-based absorbers have a lower cross-section for light capture and generally must be much thicker to capture the same amount of incident light. Silicon-based absorbers tend to be rigid, not flexible.

The n-type chalcogenide compositions, particularly those incorporating at least cadmium, have been used in photovoltaic devices as buffer layers. These materials generally have a band gap that is useful to help form a p-n junction proximal to the interface between the n-type and p-type materials. Like p-type materials, n-type chalcogenide layers can be thin enough to be used in flexible photovoltaic devices.

These chalcogenide based photovoltaic cells frequently also include other layers such as transparent conductive layers and window layers.

Heterojunction photovoltaic cells, especially those based on p-type and n-type chalcogenides, are water sensitive and can unduly degrade in the presence of too much water. Also, the thinner, flexible layers are vulnerable to thermal and other delamination or cracking stresses. Delamination and cracking not only can undermine device performance, but the resultant delamination and cracking also can exacerbate moisture intrusion. Therefore, to enhance service life, strong adhesion between device components is important to resist delamination, cracking, and moisture intrusion.

To protect heterojunction photovoltaic solar cells, especially chalcogenide-based solar cells, from detrimental moisture degradation, one or more hermetic barrier films can be deposited over the devices. FIG. 1 schematically illustrates one such approach. This device comprises a support 2, a backside electrical contact 3, an absorber layer 4, a buffer layer 5, a transparent conductive layer 6, an electrically conductive grid 7 and a barrier layer 8.

The barrier layer 8 of such a device may tend to show poor adhesion to the top surface(s) of the device. In particular, the adhesion between barrier materials and underlying transparent conductive materials and/or conductive collection grids may not be as strong as desired. Additionally, the adhesion between the grids and other materials, such as the TCO compositions, also may be poor. These issues can result in undue delamination 100 or in a rupture of the continuous hermetic barrier film and/or open pathways 110 allowing water intrusion to reach the chalcogenide compositions too easily. This can lead to subsequent device performance degradation and ultimately failure.

It is known to use silicon nitride films for passivation in the context of silicon-based solar cells. However, silicon-based solar cells tend to be thicker and much more rigid than chalcogenide-based cells. Accordingly, interlayer adhesion is much less of an issue in the context of silicon-based solar cells. Additionally, silicon-based solar cells have good moisture resistance so that moisture intrusion is much less of a concern for silicon-based solar cells.

SUMMARY OF THE INVENTION

The present invention provides strategies for improving the adhesion between a barrier layer and other layer(s) of a photovoltaic device, such as a transparent conductive layer or region and/or an electrically conductive grid material. As a consequence, these strategies are particularly useful in the fabrication of heterojunction solar cells such as chalcogenide-based solar cells. Resultant cells are more resistant to delamination, rupture, and/or moisture intrusion. Devices protected by the strategies of the present invention have enhanced service life. Surprisingly the inventors have found that incorporation of a unique adhesion promoting layer or region between (a) the top layer of the cell (e.g. the transparent conductive layer which has on a portion of its surface the electrical connector (typically an electrically conducting grid) and (b) a barrier layer provides a photovoltaic device that has improved protection and most notably for chalcogenide based cells improved moisture resistance as measured by the retained efficiency of the device over time. Adhesion is improved to such a degree that the adhesion promoting layer and the dielectric barrier materials can cooperate to provide a hermetic seal over devices to protect against damage induced by environmental conditions, including damage due to water intrusion. Additionally, the adhesion promoting layer functions as a barrier to the migration of various elements such as Na, Li, and the lanthanoid series of elements (Ln) into the barrier layer.

In one aspect, the invention provides a photovoltaic device that comprises:

a) a substrate having a light incident surface and a backside surface and comprising at least one photovoltaic absorber, and, on a portion of the light incident surface, at least one electrical contact electrically preferably connected to the absorber;

b) an optically transmissive adhesion promoting region comprising a metal layer or a metal nitride layer or a metal carbide layer, or a combination thereof, over at least a portion of the light incident surface of the substrate and the electrical contact; and c) a dielectric barrier region positioned over the adhesion promoting region.

In yet another aspect, the invention provides a method of making a photovoltaic device. The method comprises the steps of:

a) providing a substrate having a light incident surface and a backside surface and comprising at least one photovoltaic absorber, and, on a portion of the light incident surface, at least one electrical contact electrically preferably connected to the absorber;

b) causing an optically transmissive adhesion promoting region comprising a metal layer or a metal nitride layer or a metal carbide layer, or a combination thereof to be formed over at least a portion of the light incident surface and electrical contact; and c) causing a dielectric barrier region to be formed over the adhesion promoting region.

BRIEF DESCRIPTION OF THE DRAWINGS

The above mentioned and other advantages of the present invention, and the manner of attaining them, will become more apparent and the invention itself will be better understood by reference to the following description of the embodiments of the invention taken in conjunction with the accompanying drawings, wherein.

DETAILED DESCRIPTION OF PRESENTLY PREFERRED EMBODIMENTS

The embodiments of the present invention described below are not intended to be exhaustive or to limit the invention to the precise forms disclosed in the following detailed description. Rather the embodiments are chosen and described so that others skilled in the art may appreciate and understand the principles and practices of the present invention. All patents, pending patent applications, published patent applications, and technical articles cited herein are incorporated herein by reference in their respective entireties for all purposes.

The photovoltaic cell may be any cell known in the industry having an absorber and an electrical contact on a portion of the light incident side. However, preferably the cell is a chalcogenide based cell.

Figure 1:
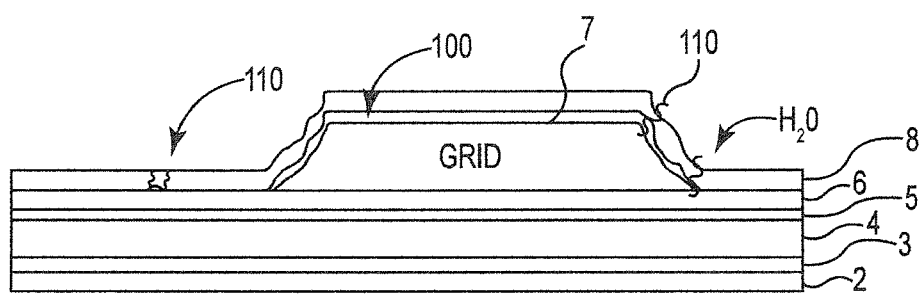
FIG. 1 is a schematic cross section of a photovoltaic device of the prior art.
Figure 2:
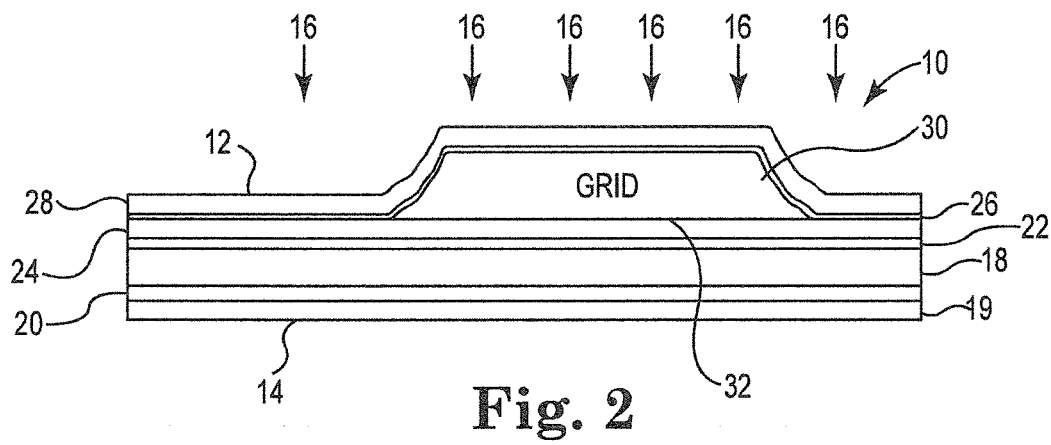
FIG. 2 is a schematic cross section of a photovoltaic device according to the present invention.

FIG. 2 schematically shows one embodiment of a photovoltaic device 10 of the present invention. Device 10 desirably is flexible to allow it to be mounted to surfaces incorporating some curvature. In preferred embodiments, device 10 is sufficiently flexible to be wrapped around a mandrel having a diameter of 50 cm, preferably about 40 cm, more preferably about 25 cm without cracking at a temperature of 25° C. Device 10 includes a light incident face 12 that receives light rays 16 and a backside face 14.

Device 10 includes a photovoltaic absorber region 18. In preferred embodiments, region 18 is preferably a chalcogenide-containing absorber region. Region 18 can be a single integral layer as illustrated or can be formed from one or more layers. The region 18 absorbs light energy embodied in the light rays 16 and then photovoltaically converts this light energy into electric energy.

The chalcogenide absorber region 18 preferably incorporates at least one IB-IIIB-chalcogenide, such as IB-IIIB-selenides, IB-IIIB-sulfides, and IB-IIIB-selenides-sulfides that include at least one of copper, indium, and/or gallium. In many embodiments, these materials are present in polycrystalline form. Advantageously, these materials exhibit excellent cross-sections for light absorption that allow region 18 to be very thin and flexible. In illustrative embodiments, a typical absorber region 18 may have a thickness in the range from about 1 µm to about 5 µm, preferably about 2 µm to about 3 µm.

Representative examples of such IB-IIIB-chalcogenides incorporate one or more of copper, indium, and/or gallium in addition to selenium and/or sulfur. Some embodiments include sulfides or selenides of copper and indium. Additional embodiments include selenides or sulfides of copper, indium, and gallium. Specific examples include but are not limited to copper indium selenides, copper indium gallium selenides, copper gallium selenides, copper indium sulfides, copper indium gallium sulfides, copper gallium selenides, copper indium sulfide selenides, copper gallium sulfide selenides, copper indium aluminum selenides and copper indium gallium sulfide selenides (all of which are referred to herein as CIGS) materials. In representative embodiments, CIGS materials with photovoltaic properties may be represented by the formula $CuIn_{(1-x)}Ga_xSe_{(2-y)}S_y$ where x is 0 to 1 and y is 0 to 2. The copper indium selenides and copper indium gallium selenides are preferred. The chalcogenide absorber may be doped with other materials such as sodium as is known in the art.

The absorber region 18 may be formed by any suitable method using a variety of one or more techniques such as evaporation, sputtering, electrodeposition, spraying, and sintering. One preferred method is co-evaporation of the constituent elements from one or more suitable targets, where the individual constituent elements are thermally evaporated on a hot surface coincidentally at the same time, sequentially, or a combination of these to form a precursor to region 18. After deposition, the deposited materials may be subjected to one or more further treatments to finalize the region 18. In many embodiments, CIGS materials have p-type characteristics.

In addition to absorber region 18, device 10 may also include one or more other components including support 19, backside electrical contact region 20, buffer region 22, and transparent conducting (TC) region 24, which is preferably a transparent conductive oxide but alternatively may be a very thin transparent metal film. As shown, each of these regions can be a single integral layer as illustrated or can be formed from one or more layers. The support 19 may be rigid or flexible, but desirably is flexible in those embodiments in which the device 10 may be used in combination with non-flat surfaces. Support 19 may be formed from a wide range of materials. These include glass, quartz, other ceramic materials, polymers, metals, metal alloys, intermetallic compositions, paper, woven or non-woven fabrics, combinations of these, and the like. Stainless steel is preferred.

The backside electrical contact region 20 provides a convenient way to electrically couple device 10 to external circuitry. Contact region 20 may be formed from a wide range of electrically conductive materials, including one or more of Cu, Mo, Ag, Al, Cr, Ni, Ti, Ta, Nb, W combinations of these, and the like. Conductive compositions incorporating Mo may be used in an illustrative embodiment. The backside electrical contact region 20 also helps to isolate the absorber region 18 from the support to minimize migration of support constituents into the absorber layer. For instance, backside electrical contact region 20 can help to block the migration of Fe and Ni constituents of a stainless steel support into the absorber region 20. The backside electrical contact region 20 also can protect the support such as by protecting against Se if Se is used in the formation of absorber region 18.

Optional layers (not shown), in addition to the support 19, may be used proximal to backside face 14 in accordance with conventional practices now known or hereafter developed to help enhance adhesion between backside electrical contact region 20 and the support 19 and/or between backside electrical contact region 20 and the absorber region 18. Additionally, one or more barrier layers (not shown) also may be provided over the backside electrical contact region 20 to help isolate device 10 from the ambient and/or to electrically isolate device 10. One or more additional layers (not shown) may be deposited onto the backside of the support for a variety of reasons, including helping prevent selenization of the substrate during fabrication of the cell. Such one or more layers typically include molybdenum.

The device 10 when based upon chalcogenide materials often is provided with a heterojunction structure in contrast to silicon-based semiconductor cells that have a homojunction structure. A heterojunction may be formed between the absorber region 18 and the TC region 24 buffered by buffer region 22. An optional window region (not shown) also may be present. Each of these regions is shown as a single integral layer, but can be a single integral layer as illustrated or can be formed from one or more layers.

Buffer region 22 generally comprises an n-type semiconductor material with a suitable band gap to help form a p-n junction proximal to the interface between the absorber region 18 and the buffer region 22. Suitable band gaps for the buffer region 22 generally are in the range from about 1.7 eV to about 3.6 eV when the absorber layer is a CIGS material having a band gap in the range from about 1.0 to about 1.6 eV. CdS has a band gap of about 2.4 eV.

Illustrative buffer layer embodiments generally may have a thickness in the range from about 10 nm to about 200 nm.

A wide range of n-type semiconductor materials may be used to form buffer region 22. Illustrative materials include selenides, sulfides, and/or oxides of one or more of cadmium, zinc, lead, indium, tin, combinations of these and the like, optionally doped with materials including one or more of fluorine, sodium, combinations of these and the like. In some illustrative embodiments, buffer region 22 is a selenide and/or sulfide including cadmium and optionally at least one other metal such as zinc. Other illustrative embodiments would include sulfides and/or selenides of zinc. Additional illustrative embodiments may incorporate oxides of tin doped with material(s) such as fluorine. A wide range of methods, such as for example, chemical bath deposition, partial electrolyte treatment, evaporation, sputtering, or other deposition technique, can be used to form buffer region 22.

As noted, device 10 may include an optional window region or layer. A window region can help to protect against shunts and also may protect buffer region 22 during subsequent deposition of the TC region 24. The window region may be formed from a wide range of materials and often is formed from a resistive, transparent oxide such as an oxide of Zn, In, Cd, Sn, combinations of these and the like. An exemplary window material is intrinsic ZnO. A typical window region may have a thickness in the range from about 10 nm to about 200 nm, preferably about 50 nm to about 150 nm, more preferably about 80 nm to about 120 nm.

The TC region 24 is interposed between the buffer region 22 and light incident surface 12 and is electrically coupled to the buffer region 22 to provide a top conductive electrode for the device 10. In many suitable embodiments where the TC region is a transparent conductive oxide (TCO), the TCO layer has a thickness in the range from about 10 nm to about 1500 nm, preferably about 150 nm to about 200 nm. As shown, the TCO region 24 is in direct contact with the buffer region 22. As an example of another option, a window region may be interposed between TCO region 24 and buffer region 22. One or more intervening layers optionally may be interposed for a variety of reasons such as to promote adhesion, enhance electrical performance, or the like.

A wide variety of transparent conducting oxides (TCO) or combinations of these may be incorporated into the transparent conductive region 24. Examples include fluorine-doped tin oxide, tin oxide, indium oxide, indium tin oxide (ITO), aluminum doped zinc oxide (AZO), zinc oxide, combinations of these, and the like. In one illustrative embodiment, the transparent conductive region 24 is indium tin oxide. TCO layers are conveniently formed via sputtering or other suitable deposition technique.

The transparent conductive region 24 may alternatively be a very thin metal film (e.g., a metal film having a thickness greater than about 5 nm and more preferably greater than about 30 nm. Additionally, the transparent conductive region is preferably less than about 200 nm thick, more preferably less than about 100 nm thick. These representative embodiments result in films that are sufficiently transparent to allow incident light to reach the absorber region 20). Preferably, the transparent conductive layer is a transparent conductive oxide. As used herein, the term "metal" refers not only to metals, but also to metal admixtures such as alloys, intermetallic compositions, combinations of these, and the like. These metal compositions optionally may be doped. Examples of metals that could be used to form thin, optically transparent layers 30 include the metals suitable for use in the backside electrical contact 28, combinations of these, and the like.

Adhesion promoting region 26, dielectric barrier region 28, and electrically conductive collection grid 30 are positioned over the substrate TCO region 24. The grid desirably at least includes conductive metals such as nickel, copper, silver, and the like and/or combinations thereof. In one illustrative embodiment, the grid has a dual layer construction comprising nickel and silver. Since these materials are not transparent, they are deposited as a grid of spaced apart lines so that the grid occupies a relatively small footprint on the surface (e.g., in some embodiments, the grid occupies about 5% or less, even about 2% or less, or even about 1% or less of the total surface area associated with light capture to allow the photoactive materials to be exposed to incident light). The adhesion promoting layer 26 and the barrier region 28 are each shown as a single layer. However, these regions can be formed from more than one layer if desired.

As an overview of the methods of the present invention for forming these constituents of device 10, at least a portion of the adhesion promoting region 26 is formed prior to formation of at least a portion of the barrier region 28. Preferably, at least substantially the entire adhesion promoting region 26 is formed before the barrier region 28 is formed. Additionally, adhesion promoting layer 26 can block the migration of elements from layers or regions below the barrier region that would negatively impact the performance of the barrier layer. Such elements include, for example, Na, Li, and the lanthanoid (Ln) series of elements.

Advantageously, the methodologies of the present invention enhance the adhesion quality of the interface between the barrier region 28 and at least one of the grid 30 and the TCO region 24 in the context of photovoltaic devices and in particular flexible chalcogenide-based such as CIGS-based devices. This methodology provides enhanced protection against delamination and moisture intrusion into the device. Device performance and life are extended as a result. In preferred embodiments, the device of the invention retains at least 90% of its initial efficiency after exposure to 85° C. and 85% relative humidity for a time of at least 1000 hours.

The adhesion promoting region or layer 26 is formed from one or more metals, metal nitrides and/or metal carbides, wherein the adhesion promoting layer preferably contains at least one of Cr, Ti, Ta, and Zr or a combination thereof. Furthermore, the adhesion promoting region 26 is suitably thin to be optically transmissive. By this is meant region 26 has an optical transmittance of greater than or equal to about 70% between 400 nm and 1300 nm. Preferably, adhesion promoting layer has an optical transmittance of greater that or equal to 80% in the same range.

The adhesion promoting layer is preferably deposited via magnetron sputtering. Where a preferred $TaN_x$ barrier layer is to be formed, the barrier layer preferably is deposited via reactive magnetron sputtering using a Ta target and a mixture of nitrogen ($N_2$) and argon gas. The mole fraction of $N_2$ in the gas feed is preferably more than 0.1, more preferably more than 0.2 and preferably more than 0.6. Prior to the deposition, a suitable base pressure in the chamber is in the range from about $1\times10^{-8}$ to about $1\times10^{-5}$ Torr. The operating pressure at which sputtering occurs desirably is in the range from about 2 mTorr to about 10 mTorr.

Adhesion promoting region 26 may have a wide range of thicknesses, provided that if region 26 is too thick, then transparency may unduly suffer without providing sufficient extra performance. Illustrative embodiments of adhesion promoting region 26 may have a thickness less than about 200 nm, preferably less than about 100 nm, more preferably still less than about 50 nm and most preferably less than about 20 nm. Additionally, illustrative embodiments of the adhesion promoting region 26 can have a thickness of more than about 1 nm, preferably more than about 2 nm.

Dielectric barrier region 28 is formed from one or more suitable dielectric materials that have sufficiently low dielectric constants to help electrically isolate TCO region 24 from the ambient environment except in those locations where electric contact is desired through the grid 30 to TCO 24 at, for example, interface 32. In many embodiments, dielectric barrier region 28 has a dielectric constant in the range of 2 to about 120, preferably 2 to about 50, more preferably 3 to about 10. Additionally, dielectric region 28 also desirably provides barrier protection against water vapor intrusion. In many embodiments, dielectric barrier region 28 is characterized by a water vapor transmission rate (WVTR) in the range of about $10^0$ to about $10^{-5}$ g/m$^2$·day, but is most preferably less than about $5\times10^{-4}$ g/m$^2$·day. The WVTR for a material may be determined according to the methodology described in ASTM E 96 or in other tests such as the calcium test (Wolf et al. Plasma Processes and Polymers, 2007, 4, S185-S189).

The dielectric barrier region 28 may be formed from a variety of material(s). Preferably, the materials used in barrier region 28 are nonporous. The barrier coatings useful in this invention preferably exhibit optical transmittance ≥70% in the transmission wavelength range 400-1300 nm and more preferably exhibit ≥85% transmission in the same range.

Dielectric barrier region 28 may have a wide range of thicknesses. If too thin, then the electric insulating properties and protection against moisture intrusion may not be as robust as might be desired. If too thick, then transparency may unduly suffer without providing sufficient extra performance. Furthermore, if too thick, the dielectric barrier region 28 may be more susceptible to cracking. Balancing these concerns, illustrative embodiments of barrier region 28 may have a thickness of less than about 2000 nm, preferably less than about 1000 nm, more preferably less than about 500 nm, more preferably still less than about 250 nm, and most preferably less than about 150 nm. Additionally, illustrative embodiments of the dielectric barrier region 28 can have a thickness of more than about 10 nm, and more preferably more than about 50 nm.

Dielectric barrier region 28 can be selected from a group of metal oxides, carbides, nitrides and the like or combinations thereof. In one preferred embodiment, the barrier material is an oxide and/or nitride of silicon. These embodiments provide excellent dielectric and moisture protection. In some embodiments, dielectric barrier region 28 preferably is formed from silicon nitride or a material incorporating silicon, nitrogen, and oxygen (a silicon oxy nitride). In other embodiments in which dielectric barrier region 28 is formed from two or more sublayers, a first sublayer may be formed from silicon nitride, and a second sublayer may be formed from a silicon oxy nitride. When two or more sublayers are used, it is preferred that the bottom layer (i.e., the layer in contact with the TCO layer) be silicon nitride.

Representative embodiments of silicon nitride may be represented by the formula $SiN_x$, and representative embodiments of silicon oxy nitride may be represented by the formula $SiO_yN_z$. In these formulae, x is preferably greater than about 1.2, more preferably greater that about 1.3, and preferably less than about 1.5, more preferably less than about 1.4; y is preferably greater than 0, and preferably less than about 0.8, even more preferably less than about 0.5 and still more preferably less than about 0.05; and z is greater than about 0.8, preferably greater than about 1, and less than about 1.4, more preferably less than about 1.3. Other illustrative ranges for x, y, and z are those wherein x is in the range from about 1.2 to about 1.5, preferably about 1.3 to about 1.4; y is preferably in the range from greater than 0 to about 0.8, preferably from about 0.1 to about 0.5; and z is in the range from about 0.8 to about 1.4, preferably about 1.0 to about 1.3. Desirably, x, y, and z are selected so that the barrier region 34, or each sublayer thereof as appropriate, has a refractive index in the range from about 1.80 to about 3. As an example of one suitable embodiment, silicon nitride of the formula $SiN_{1.3}$ and having a refractive index of 2.03 would be suitable in the practice of the present invention.

Adhesion promoting region 26 and dielectric barrier region 28 can be formed on the device 10 in a variety of ways. For example, they may be deposited via reactive magnetron sputtering using techniques known in the art.

As an option, the adhesion promoting region 26 and the dielectric barrier region 28 also may be prepared by other methodologies, including but not limited to low temperature vacuum methods known to those skilled in the art including chemical vapor deposition (CVD), plasma-enhanced chemical vapor deposition (PECVD), atomic layer deposition (ALD) and others.

Grid 30 can be formed from a wide range of electrically conducting materials, but most desirably are formed from one or more metals, metal alloys, or intermetallic compositions. Exemplary contact materials include one or more of Ag, Al, Cu, Cr, Ni, Ti, combinations of these, and the like. A grid 30 incorporating Ag or Ag/Ni contacts is preferred.

An optional region (not shown) may include one or more additional barrier layers provided over the dielectric barrier region 28 to help further protect device 10. In many modes of practice, these additional barrier layers, if any, are incorporated into device 10 after desired electrical connections are made to grid 30.

The present invention will now be described with reference to the following illustrative examples. In the first of these examples the method of accelerated aging was performed on representative test coupons comprising a thin optically transmissive bottom layer of aluminum. The effective WVTR was measured by monitoring changes in optical density over time after exposure to heat and humidity. The accelerated exposure was conducted in an All-American 25× steam sterilizer equipped with an excess pressure relief valve. NANOPURE™ water was used exclusively in the pressure vessel to avoid contamination. For each sample, the initial optical density was measured at 9 points equally distributed across the surface of the sample. The samples were then placed vertically in a sample holder and introduced into the pressure vessel for testing. The temperature was set to 115° C. using an external temperature controller. The temperature reading did not exceed ±1° C. of the set point. At this temperature, the pressure inside of the vessel was approximately 12 psig. The samples were exposed for the desired duration and then removed from the pressure vessel and the optical density measured at the same positions as initially measured. The samples were then returned to the pressure vessel and the process repeated. Testing was discontinued if the samples failed, that is when the normalized optical density decreased by more than 10% of the initial optical density value. Optical density measurements were carried out using an X-RITE™ 361T transmission densitometer using a 3 mm aperture. Density measurements were taken for both orthogonal and ultraviolet responses, although only the former were used for comparison of relative moisture barrier performance. Further illustrative examples are provided in which the photovoltaic performance of devices was monitored over time during exposure to damp heat conditions of 85° C./85% RH. CMS-based devices, prepared with and without the adhesion promoting layer 26 made substantially as set forth in Example 5, are subjected to damp-heat, 85° C./85% RH, environmental weathering conditions as specified in IEC standard 61646. During the exposure, the cells are positioned vertically on a stainless steel fixture situated above a pool of DI water within a lab oven held at 85° C.±5° C. Prior to collecting the I-V characteristic measurement, the samples rest in a dry nitrogen purged box for at least 12 hrs. Then, just before collecting the I-V characteristic measurement, the samples are light soaked for at least 5 minutes using a SpectraNova solar simulator. Immediately following this measurement the devices are returned to the damp-heat environment for the next test period. This process is repeated for each time period.

The device efficiency is extracted from a current-voltage (I-V) characteristic curve that is measured before and after each step using a Class AAA solar simulator. The I-V characteristic measurement apparatus and procedure meet the requirements specified in the IEC 60904 (parts 1-10) and 60891 standards. For each I-V measurement, electrical contact is established using a 5-μm-radius tungsten probe tip placed in contact with the collection grid bus bar and the Molybdenum coated back side was grounded thru an Au coated brass platen. During the I-V characteristic measurement, the temperature of the platen and the device is maintained at 25° C. Prior to the measurement the Xe arc lamp is given 15 minutes to stabilize. Then, the lamp irradiance is set to AM1.5 1000 W/m2 using a calibrated silicon reference device with BK-7 filter. The uncertainty in the efficiency measurement is ±4% relative.

Example 1

Test coupons according to the invention were prepared. A thin film of aluminum (about 30 nm thick) was sputter-deposited onto three 1"×1" pieces of soda-lime glass. This was followed by a layer of indium tin oxide (ITO) (about 130 nm thick). Indium tin oxide (ITO) films were prepared using a custom RF magnetron sputter chamber from a 100 mm diameter, 5 mm thick ITO ceramic target (90 wt % $In_2O_3$, 10 wt % $SnO_2$) using gas flows of argon (14 sccm) and oxygen (2 sccm), controlled using mass flow controllers, to achieve a working gas pressure of 2.8 mTorr. The substrate temperature was held at 150° C. during deposition. A mask was applied to shield an area of the sample and expose only the area to be covered by a conductive grid. Layers of Ni and then Ag having a total thickness of about 1600 nm were sequentially deposited by E-beam evaporation. Prior to evaporation, the chamber base pressure is reduced to $<2\times10^{-6}$ Torr. All depositions can be carried out at 9.0 kV, while current values are 0.130 and 0.042 Amps for Ni and Ag, respectively. The deposition rates can be controlled in process using a Maxtek 260 quartz crystal deposition controller at 2.0 Å/s and 15.0 Å/s for Ni and Ag, respectively. Ni shots (99.9999%, obtained from International Advanced Materials) can be evaporated from a 7 cc graphite crucible, while Ag pellets (99.9999%, Alfa Aesar) can be evaporated from a 7 cc molybdenum crucible. An ultra-thin layer (about 10 nm thick) of tantalum nitride adhesion promoting layer was sputter deposited over the silver grid and the ITO layer. The $TaN_x$ layer was prepared using a custom RF magnetron sputter chamber from a 50 mm diameter, 6.4 mm thick Ta target using $N_2$ sputtering gas. $TaN_x$ films were deposited over a three-minute period at a power of 140 watts and a pressure of 4 mTorr. The base pressure prior to deposition is less than $1.0\times10^{-5}$ Torr. The deposition of $TaN_x$ was followed by a layer of silicon nitride ($Si_3N_4$) of about 150 nm thickness, prepared by reactive sputtering from a 50 mm Si target using an Ar:$N_2$ (50:50) sputtering gas mixture at 4 mTorr.

Figure 3:
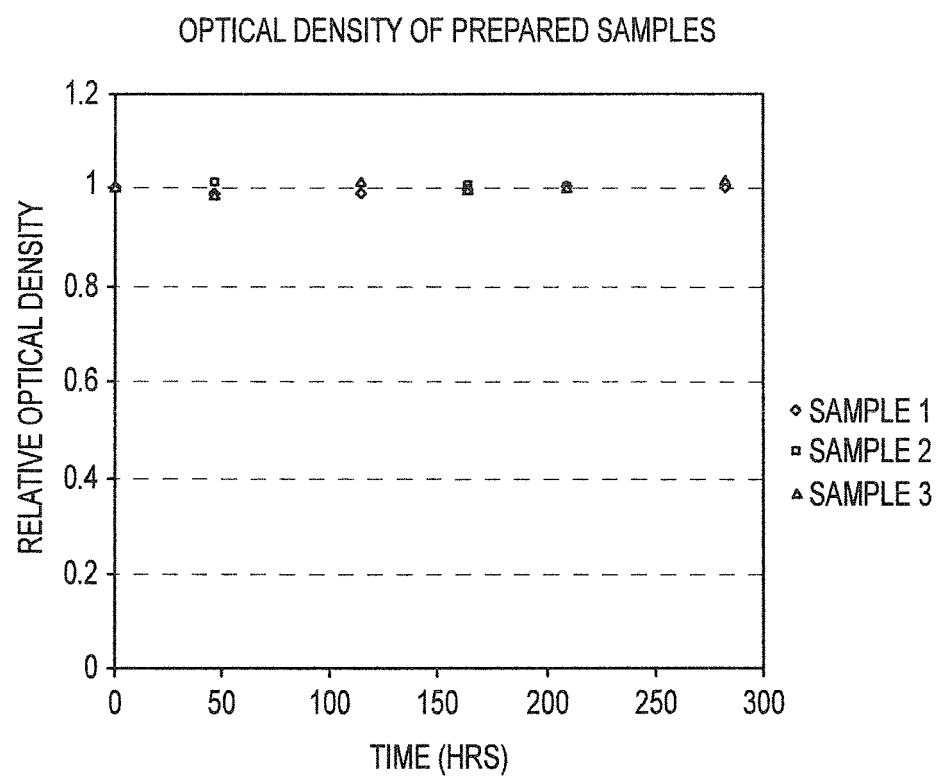
FIG. 3 is a graph showing relative optical density of model substrates according to the invention after exposure to damp heat conditions of 115° C./100% relative humidity (RH).

The samples were then placed in a pressure cooker at 115° C. and 100% relative humidity for accelerated exposure testing. Changes in the optical density of the Al film were monitored periodically as described above and are reported in FIG. 3. The optical density of the Al film was measured to determine the extent of oxidation of the Al to aluminum oxide due to exposure to moisture. The formation of a more transparent aluminum oxide layer leads to a decrease in optical density. As seen in FIG. 3, after over 536 hours at 115° C./100% RH, the optical density of all three samples remained at about 100%.

Example 2

Samples according to the invention were prepared as described in Example 1 except that different adhesion promoting materials were used in combination with the dielectric barrier of $Si_3N_4$ as the top surface of the device. The $Si_3N_4$ barrier layer was about 150 nm thick. Additionally, a comparative device was prepared that did not employ an adhesion promoting layer.

The following materials were used as the adhesion promoting layer:

| Example | Adhesion Promoting Mat'l. | Thickness (ca. nm) |
| --- | --- | --- |
| 2A | Cr | 5 |
| 2B | Ti | 10 |
| 2C | Ta | 10 |
| Comparative | None | — |

Figure 4:
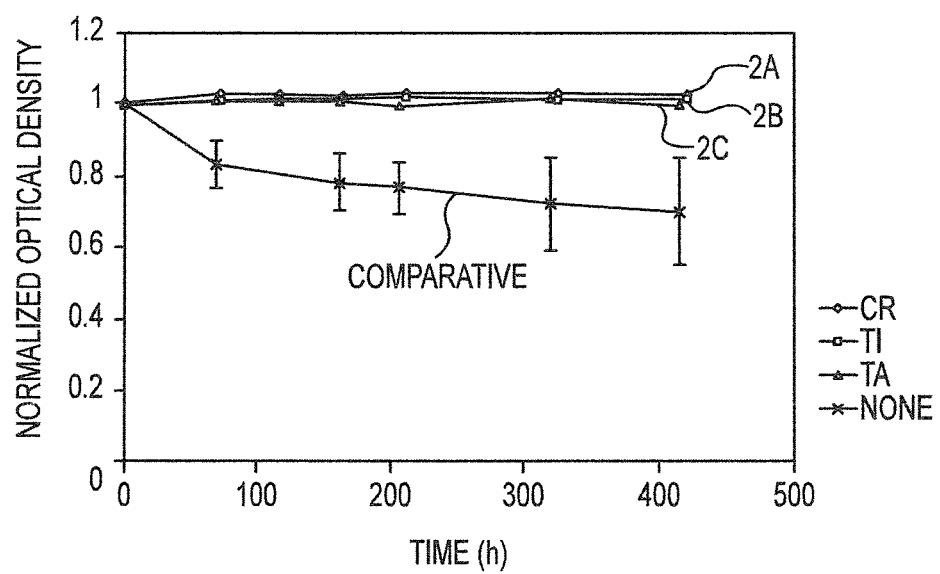
FIG. 4 is a graph showing relative optical density of samples according to the invention compared with the relative optical density of a prior art sample after various lengths of exposure to damp heat conditions of 115° C./100% relative humidity (RH).

The samples were placed in the pressure cooker as described above and optical density was periodically measured. The results are shown in FIG. 4. The comparative example shows a marked decrease in optical density over time while Examples 2A, 2B, 2C showed no measurable decrease in optical density.

Example 3

Figure 5:
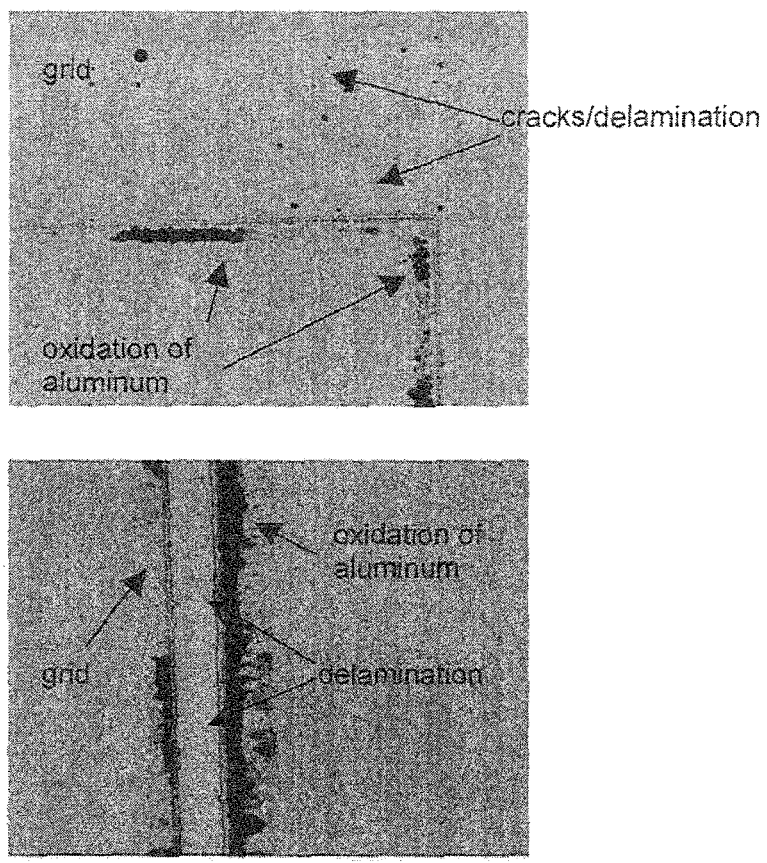
FIG. 5 is an optical microscopic image of a prior art sample after 47 hours of exposure to damp heat conditions of 115° C./100% relative humidity (RH).
Figure 6:
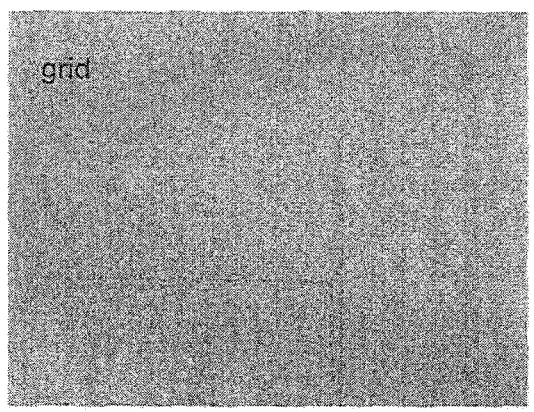
FIG. 6 is an optical microscopic image of a sample according to the invention after 210 hours of exposure to damp heat conditions of 115° C./100% relative humidity (RH).
Figure 6:
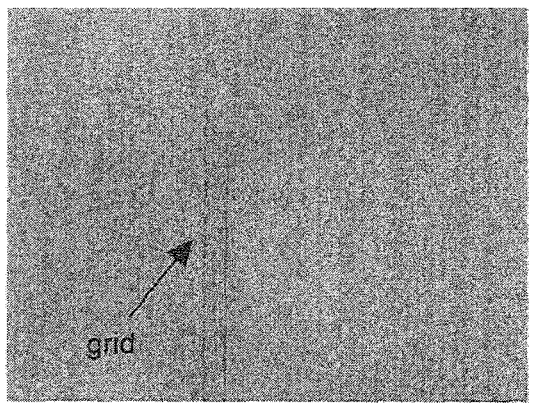

Comparative samples were prepared that comprised a 1"×1" soda lime glass, an Al film (about 30 nm thick), a silver grid (about 1000 nm thick) and a film of silicon nitride (about 150 nm thick) using conditions described in Example 1 for the respective layers. The samples were placed in the pressure cooker at 115° C. and 100% relative humidity for accelerated exposure testing. After 47 hours of exposure, the samples were removed and top down images using optical microscopy were obtained. Similarly, samples of Example 1 were imaged after 210 hours of exposure in the pressure cooker. FIG. 5 clearly shows the damage to the silicon nitride barrier and the grid on the Comparative Samples. FIG. 6 clearly shows that comparative regions of the sample comprising a tantalum nitride adhesion layer between the top surface of the device (TCO/grid) and the dielectric silicon nitride barrier layer are essentially undamaged.

Example 4

Figure 7:
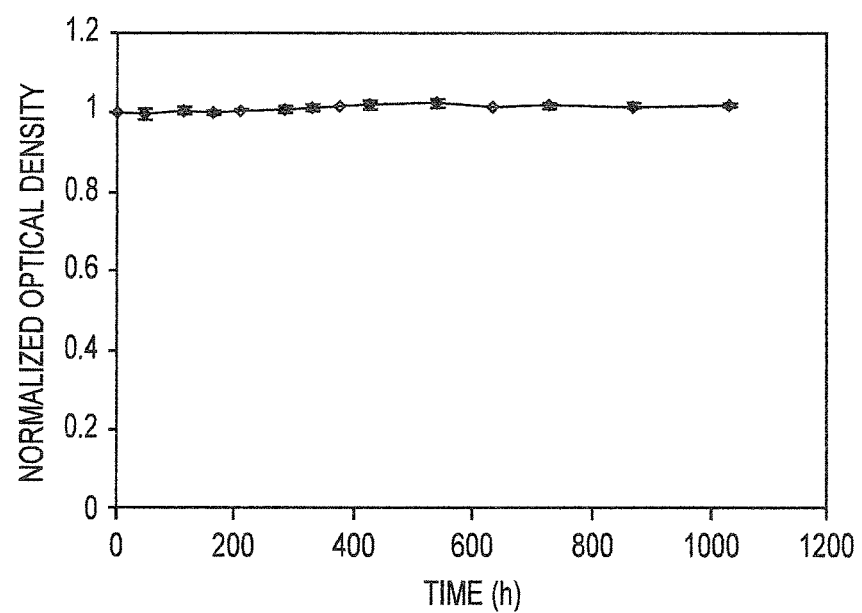
FIG. 7 is a graph showing the relative optical density of samples according to the invention after 1000 hours of exposure to heat and damp heat conditions of 115° C./100% relative humidity (RH).

Sample coupons according to the invention were prepared as described in Example 1. A thin layer (10 nm) of tantalum nitride followed by a dielectric barrier of $Si_3N_4$ was applied as the top surface of the samples (about 140 nm thick). The samples were placed in the pressure cooker at 115° C. and 100% relative humidity for accelerated exposure testing. FIG. 7 shows that there was no measurable decrease in optical density after 1000 hours of exposure.

Example 5

Photovoltaic devices according to the invention were prepared on 2" square soda-lime glass substrates, 0.7 mm thick. A layer of molybdenum was sputter deposited at 200 W, 6×10³ mbar on the glass substrate, to a final thickness of about 750-800 nm. CIGS absorber layer was deposited by a multi-stage metal co-evaporation process based on a three stage process practiced by NREL (Repins, 2008). A cadmium sulfide buffer layer was deposited by chemical bath deposition (CBD) by dipping samples into a mixture of 33 mL 0.015 M $CdSO_{4(aq)}$ and 42 mL 14.5 M $NH_4OH_{(aq)}$ (concentrated $NH_3$) at 70° C. After 1 min. 33 mL of 0.75 mL thiourea was added and the reaction was allowed to proceed for 7 min. Samples were dried at 110° C. for 30 min., then heated to 200° C. The window layer, i-ZnO, was prepared by RF magnetron sputtering of a ZnO target at 60 W and 10 mtorr sputtering pressure (0.15% $O_2$ in Ar sputtering gas) to a final thickness of about 70 nm. The devices were completed by deposition of ITO, grids, tantalum nitride adhesion layer and silicon nitride according to the procedures described in Example 1. Prior to deposition of the tantalum nitride and silicon nitride layers, individual cells were isolated by scribing down to, but not through the Mo layer. Comparative examples were prepared without the tantalum nitride adhesion layer.

Figure 8:
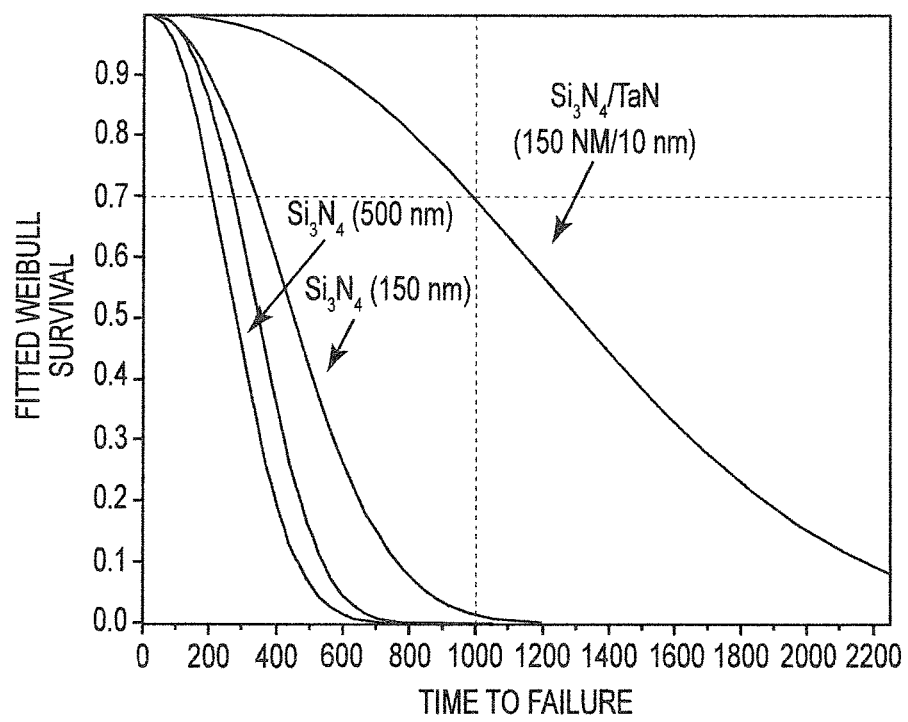
FIG. 8 is a plot showing a summary of solar cell survival probability versus damp heat (85° C./85% RH) exposure time for cells coated with $Si_3N_4$/$TaN_x$ and with other silicon nitride based barrier layers.

FIG. 8 shows a summary of the results of solar cell survival probability versus damp heat (85° C./85% RH) exposure time for cells coated with $Si_3N_4$/TaN, and with other silicon nitride based barrier layers. The performance of devices with a $TaN_x$ adhesion layer is clearly superior to those devices lacking this layer. Devices with a $TaN_x$ adhesion layer have a >70% probability of surviving 1000 h under accelerated damp heat conditions. Several devices survived greater than 3000 h under the same conditions.

Example 6

Figure 9:
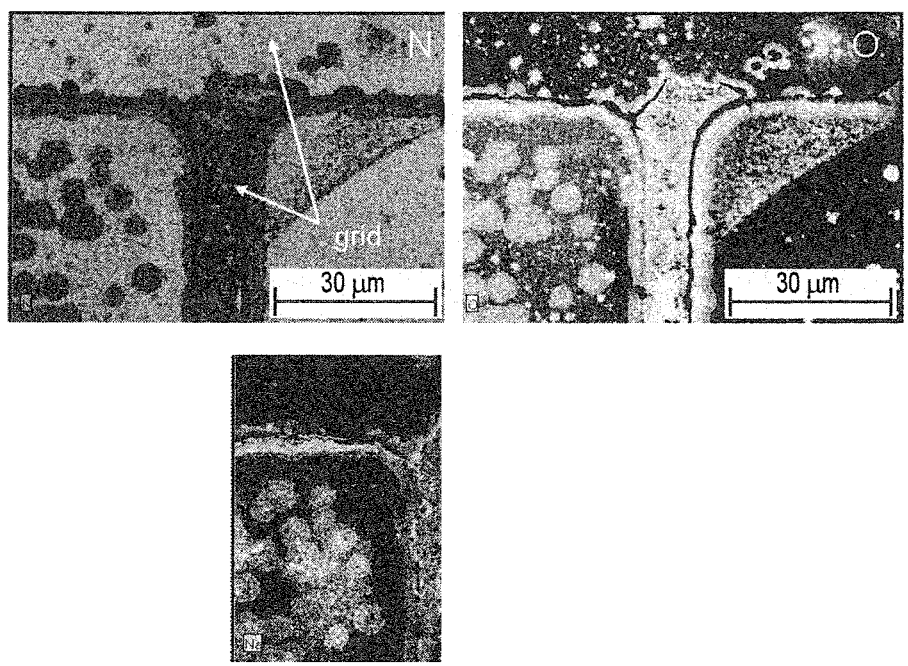
FIG. 9 shows elemental maps (EDX) for N (top, left), O (top, right) and Na (bottom) in a grid region following damp heat exposure for 380 h at 115° C./100% RH for comparative samples with silicon nitride barrier layer (150 nm).
Figure 10:
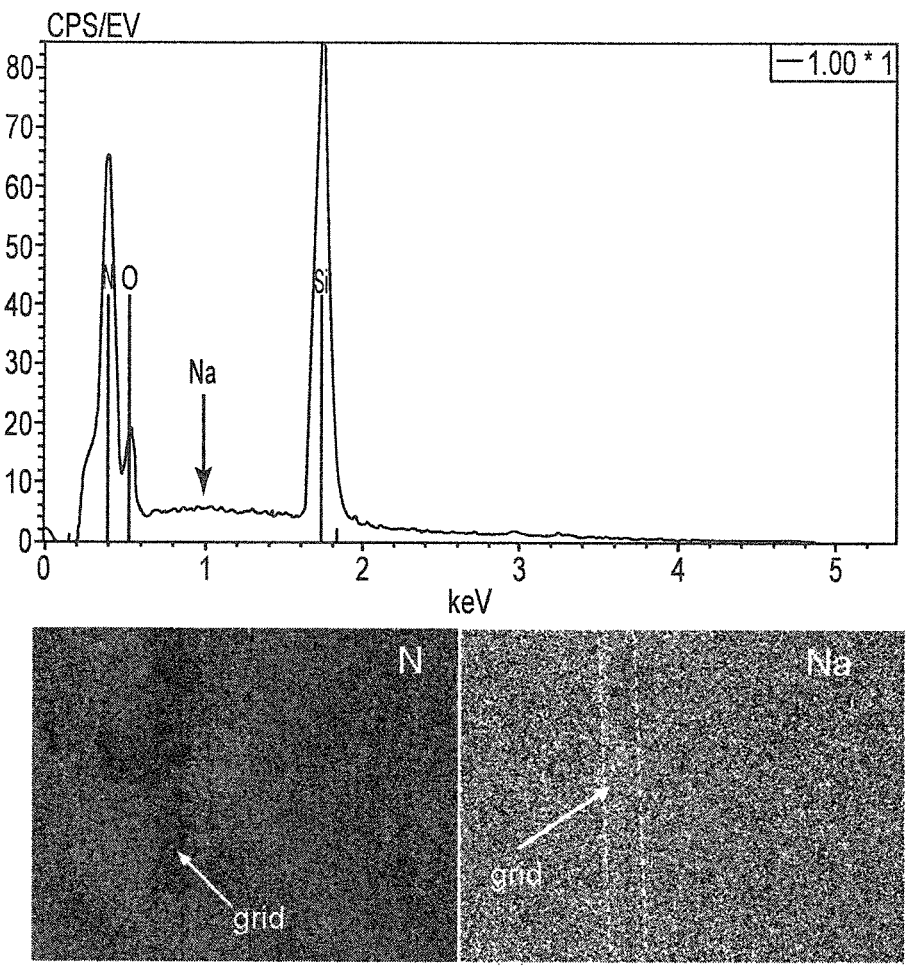
FIG. 10 shows elemental maps (EDX) for N (left) and Na (right) in a grid region following damp heat exposure for 380 h at 115° C./100% RH for samples according to the invention, with a tantalum nitride adhesion layer (10 nm) and a silicon nitride barrier layer (140 nm).

Sample coupons on soda lime glass with Al/ITO and Ni/Ag grids were prepared as described in Example 1. A thin layer (10 nm) of tantalum nitride followed by a dielectric barrier of silicon nitride (140 nm) was applied to one set of sample coupons according to the conditions described in Example 1, while only $Si_3N_4$ (150 nm) was applied to a second set for comparison. The samples were placed in the pressure cooker at 115° C. and 100% relative humidity for accelerated exposure testing for 380 h. FIG. 9 shows that the comparative samples (with silicon nitride barrier only) showed significant oxidation of the silicon nitride layer (evidenced by the reduction in N content in the grid region and associated increase in oxygen content). FIG. 9 also shows the presence of sodium at the surface of the device with a similar distribution as oxygen. In contrast, FIG. 10 shows that samples according to the invention (with the inclusion of the thin tantalum nitride layer) showed no measurable sodium at the surface of the device in the grid region.

What is claimed is:

1. A photovoltaic device having a light incident face and a backside surface, wherein the photovoltaic device comprises:
   a) a support;
   b) at least one photovoltaic absorber positioned over the support to receive light via the light incident face of the device, wherein the photovoltaic absorber comprises a chalcogenide-containing absorber having a thickness in the range from 1 micrometer to 5 micrometers;

c) a transparent conductive layer interposed between the at least one photovoltaic absorber and the light incident face of the device;

d) at least one electrical contact positioned over and in electrical communication with the transparent conductive layer and the at least one photovoltaic absorber, wherein the at least one electrical contact comprises a layer of conductive material that is less extensive than the underlying transparent conductive layer;

e) an optically transmissive adhesion promoting region comprising Cr, Ti, Ta, $TiN_x$, $TaN_x$, $TiC_x$, $TaC_x$ or is a multilayer structure comprised of a combination thereof over at least a portion of the electrical contact and the transparent conductive layer, wherein the optically transmissive adhesion promoting region has a thickness less than 50 nanometers; and f) an optically transmissive dielectric barrier region positioned over the adhesion promoting region, wherein the optically transmissive dielectric barrier region comprises silicon nitride, silicon oxide, silicon carbide, silicon oxynitride, and/or combinations thereof and wherein the optically transmissive adhesion promoting region is in contact with at least one electrical contact, the transparent conductive layer, and the optically transmissive dielectric barrier region.

2. The photovoltaic device of claim 1, wherein the absorber is a chalcogenide-containing absorber comprising copper, indium, and optionally gallium.

3. The photovoltaic device of claim 1, wherein the photovoltaic article retains at least 90% of its initial efficiency after exposure to 85° C. and 85% relative humidity for a time of at least 1000 hours.

4. The photovoltaic device of claim 1, wherein the electrical contact comprises an electrical grid.

5. The photovoltaic device of claim 4, wherein the electrical grid comprises a discontinuous layer of conductive material.

6. The photovoltaic device of claim 1, wherein the electrical contact comprises Ag or Ag/Ni.

7. The photovoltaic device of claim 1, wherein the device further comprises a buffer layer between the transparent conductive layer and the absorber.

8. The photovoltaic device claim 1, wherein the adhesion promoting region has an optical transmittance of greater than or equal to 70% between 400 nm and 1300 nm.

9. The photovoltaic device of claim 1, wherein the optical transmittance of the barrier region is greater than or equal to 70% between 400 nm and 1300 nm.

10. The photovoltaic device of claim 1, wherein the adhesion promoting region further functions as a barrier to the migration of Na, Li, and lanthanoid series elements into the dielectric barrier region.

11. The photovoltaic device of claim 1, wherein the at least one electrical contact comprises a layer of non-transparent conductive material.

12. The photovoltaic device of claim 1, wherein the optically transmissive dielectric barrier region has a water vapor transmission rate value in the range of $10^{-5}$ g/(m$^2$*day) to $10^0$ g/(m$^2$*day).

* * * * *